(12) United States Patent
Cheng et al.

(10) Patent No.: US 7,494,891 B2
(45) Date of Patent: Feb. 24, 2009

(54) TRENCH CAPACITOR WITH VOID-FREE CONDUCTOR FILL

(75) Inventors: Kangguo Cheng, Beacon, NY (US); Johnathan E. Faltermeier, Delanson, NY (US); Xi Li, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 11/533,928

(22) Filed: Sep. 21, 2006

(65) Prior Publication Data

US 2008/0076230 A1 Mar. 27, 2008

(51) Int. Cl.
*H01L 21/20* (2006.01)
(52) U.S. Cl. .................... 438/386; 438/243; 257/301; 257/E21.651
(58) Field of Classification Search .......... 438/386, 438/243, 244, 253; 257/301, E21.651
See application file for complete search history.

(56) References Cited

U.S. PATENT DOCUMENTS

| | | | |
|---|---|---|---|
| 6,194,755 B1 * | 2/2001 | Gambino et al. ............ 257/301 |
| 6,284,665 B1 | 9/2001 | Lill et al. | |
| 6,310,375 B1 | 10/2001 | Schrems | |
| 6,559,030 B1 | 5/2003 | Doan et al. | |
| 6,809,005 B2 * | 10/2004 | Ranade et al. ............... 438/426 |
| 7,157,327 B2 * | 1/2007 | Haupt ......................... 438/243 |
| 2004/0082137 A1 | 4/2004 | Huang et al. | |
| 2004/0214391 A1 | 10/2004 | Chen et al. | |
| 2005/0009268 A1 * | 1/2005 | Cheng et al. ................. 438/249 |

* cited by examiner

*Primary Examiner*—Asok K Sarkar
*Assistant Examiner*—Julia Slutsker
(74) *Attorney, Agent, or Firm*—Gibb & Rahman, LLC; Todd M. C. Li, Esq.

(57) ABSTRACT

A method forms a node dielectric in a bottle shaped trench and then deposits an initial conductor within the lower portion of the bottle shaped trench, such that a void is formed within the initial conductor. Next, the method forms an insulating collar in the upper portion of the bottle shaped trench above the initial conductor. Then, the method simultaneously etches a center portion of the insulating collar and the initial conductor until the void is exposed. This etching process forms a center opening within the insulating collar and the initial conductor. Additional conductor is deposited in the center opening such that the additional conductor is formed at least to the level of the surface of the substrate.

3 Claims, 3 Drawing Sheets

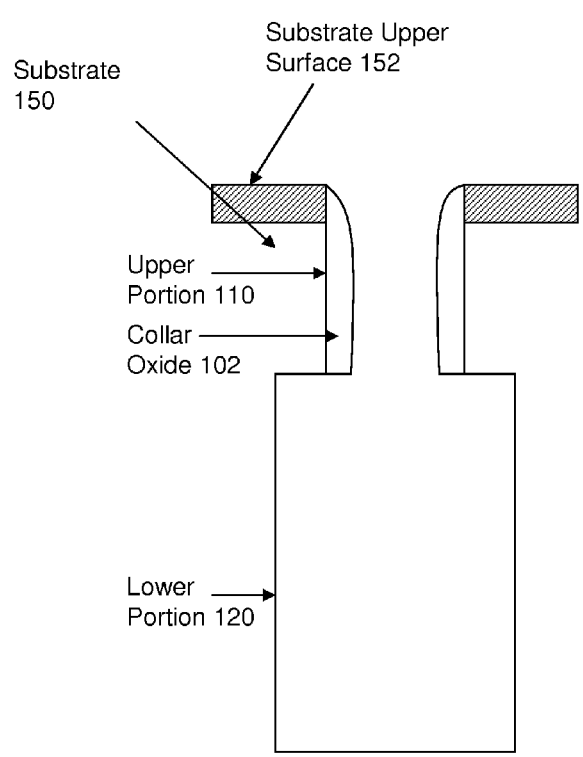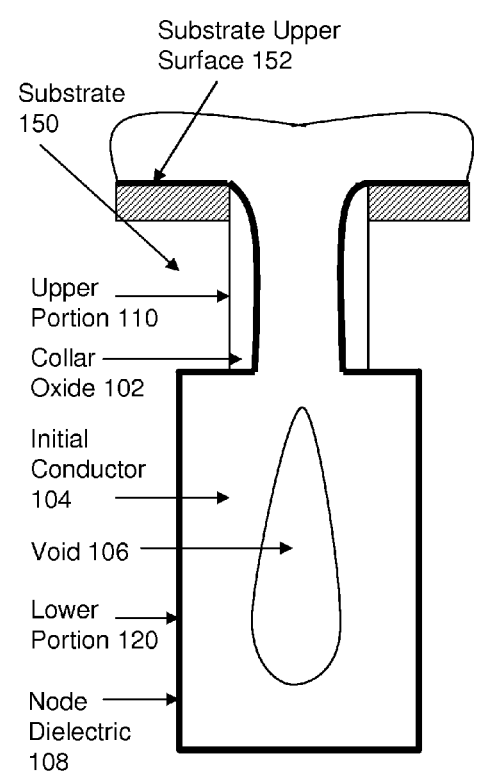
Figure 2A
Figure 2B

TRENCH CAPACITOR WITH VOID-FREE CONDUCTOR FILL

BACKGROUND

1. Field of the Invention

The embodiments of the invention generally relate to trench capacitor formation within integrated circuit structures, and, more particularly, to an improved method of eliminating voids within bottle shaped trenches.

2. Description of the Related Art

The processes, materials, and other parameters surrounding the formation of trench capacitors, and more particularly bottle shaped trench capacitor are well-known to those ordinarily skilled in the art. For example, US patent publication number 2004/0214391, the complete disclosure of which is incorporated herein by reference, discusses many aspects of the formation of bottle shaped trench capacitors. One recurring problem with bottle shaped trench capacitors is that a void can often be formed within the polysilicon conductor. Such voids increase the resistance and degrade the performance of the capacitor.

SUMMARY

One embodiment for forming a trench capacitor without a void comprises a method that begins by patterning at least one bottle shaped trench in a substrate. The bottle shaped trench has an upper portion and a lower portion. The upper portion is adjacent the surface of the substrate and the lower portion is within the substrate. The upper portion is narrower than the lower portion.

The method forms a node dielectric in the bottle shaped trench and then deposits an initial conductor within the lower portion of the bottle shaped trench, such that a void is formed within the initial conductor. Next, the method forms an insulating collar in the upper portion of the bottle shaped trench above the initial conductor. Then, the method simultaneously etches a center portion of the insulating collar and the initial conductor until the void is exposed. This etching process forms a center opening within the insulating collar and the initial conductor. Additional conductor is deposited in the center opening such that the additional conductor is formed at least to the level of the surface of the substrate.

Another embodiment herein forms the insulating collar prior to forming the node dielectric. More specifically, this alternative embodiment begins by first forming the insulating collar in the upper portion of the bottle shaped trench and then forming the node dielectric in the bottle shaped trench. Following this, the initial conductor is deposited within the lower portion of the bottle shaped trench, and again a void is formed within the initial conductor. Again, the center portion of the initial conductor is etched until the void is exposed (this etching process also forms the same center opening within the insulating collar and the initial conductor). In a similar manner to the previous embodiment, additional conductor is deposited in the center opening such that the additional conductor is formed at least to a level of the surface of the substrate.

In the above the embodiments, the additional conductor completely fills the center opening such that the void is eliminated. Also, the etching of the center opening comprises a continuous, non-stop etching process.

BRIEF DESCRIPTION OF THE DRAWINGS

The embodiments of the invention will be better understood from the following detailed description with reference to the drawings, in which:

FIGS. 2A-2D are schematic diagrams of stages of bottle trench capacitor formation according to a second embodiment of the invention.

DETAILED DESCRIPTION OF PREFERRED EMBODIMENTS

Figure 1A:
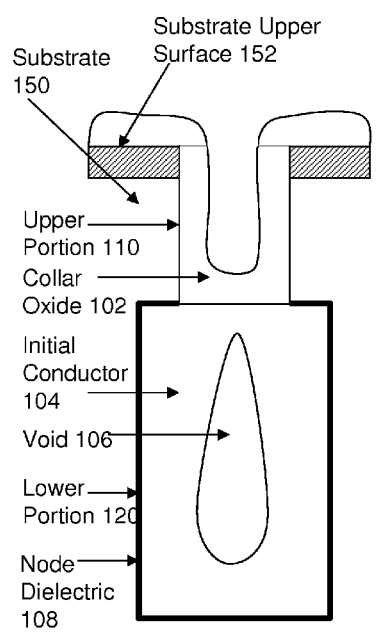
FIGS. 1A-1C are schematic diagrams of stages of bottle trench capacitor formation according to a first embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 1B:
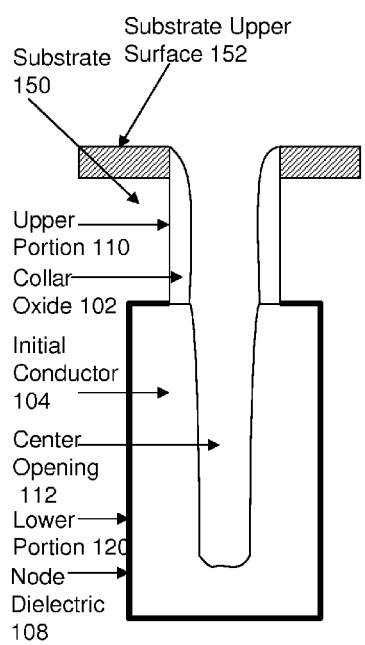
Figure 1C:
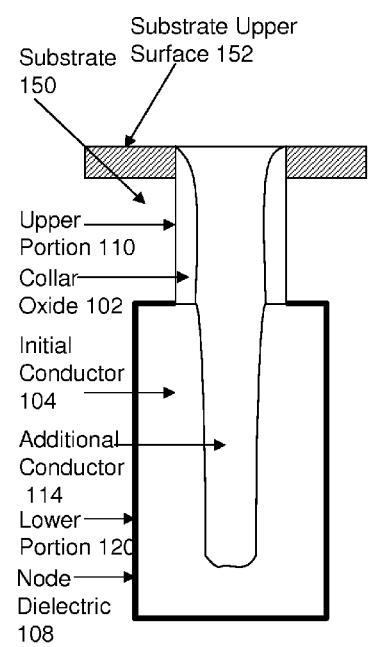

One embodiment for forming a trench capacitor without a void is shown in FIGS. 1A-1C. In this method, at least one bottle shaped trench is patterned in a substrate 150 as shown in FIG. 1A. The bottle shaped trench has an upper portion 110 and a lower portion 120. The upper portion 110 is adjacent the upper surface 152 of the substrate 150 and the lower portion 120 is within the substrate 150. The upper portion 110 is narrower than the lower portion 120.

The method forms a node dielectric 108 in the bottle shaped trench and then deposits initial conductor 104 within the lower portion 120 of the bottle shaped trench, such that a void 106 is formed within the initial conductor 104. Next, the method forms an insulating collar 102 in the upper portion 110 of the bottle shaped trench above the initial polysilicon 104. The initial conductor 104 can be any suitable conducting material, including but not limited to, amorphous silicon, polycrystalline silicon (polysilicon), amorphous or polycrystalline germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. The initial conductor material 104 can be deposited by any suitable method, including but not limited to, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition, laser assisted deposition. In one embodiment, the initial conductor 104 is doped polysilicon deposited by LPCVD. The insulating collar 102 can be any suitable insulating material, including but not limited to, silicon oxide, silicon nitride, silicon oxynitride, high-k material having a relative permittivity above about 7, or any combination of these materials. Examples of high-k material include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate, etc. The insulating collar can be formed by any suitable method, including but not limited to, thermal oxidation, chemical oxidation, thermal nitridation, atomic layer deposition (ALD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition, laser assisted deposition. In one embodiment, the insulating collar comprises silicon oxide formed by CVD followed by thermal oxidation. Then, the method simultaneously etches a center portion of the insulating collar 102 and the initial polysilicon 104 until the void 106 is exposed, as shown in FIG. 1B. The etching of the center opening 112 comprises a continuous, non-stop etching process that is controlled through etching rate and time to reach down to expose the void 106. The etching process may comprise two steps. In the first etch step, the center portion of the insulating collar 102 is etched with any suitable etch chemistry, for example, approximately 5-50 standard cubic centimeters per minute (sccm) oxygen (O2), 5-50 sccm C4F6 and 500-2000 sccm Ar. In the second etch step, the center portion of the initial polysilicon 104 is etched with any suitable etch chemistry, for example, approximately 10-100 sccm CH2F2), approximately 10-50 sccm of CF4, approximately 10-50 sccm of O2, and/or 10-100 sccm SF6.

This etching process forms a center opening 112 within the insulating collar 102 and the initial polysilicon 104.

As shown in FIG. 1C, additional conductor 114, such as doped polysilicon, metal or conducting metallic compound material that can be the same or different than the initial conductor, is deposited in the center opening 112 such that the additional conductor 114 is formed at least to the level of the upper surface 152 of the substrate 150. The initial conductor 104 and additional conductor 114 can be the same or different and, in one embodiment the initial conductor 104 is doped polysilicon and the additional conductor 114 is a metal such as, tungsten, titanium, tantalum, copper, nickel, lead, platinum, tin, silver, gold, etc. The additional conductor 114 can be overfilled and the excess polished away, if necessary. In the above the embodiments, the additional conductor 114 completely fills the center opening 112 such that the void 106 is eliminated.

Figure 2C:
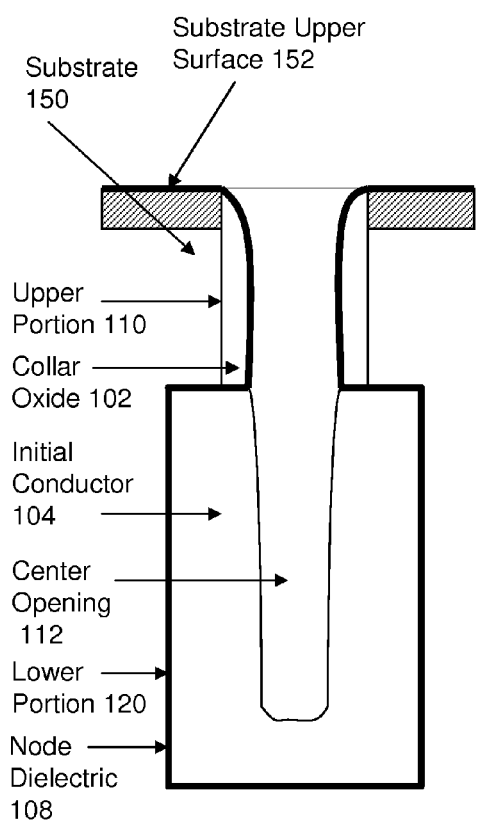
Figure 2D:
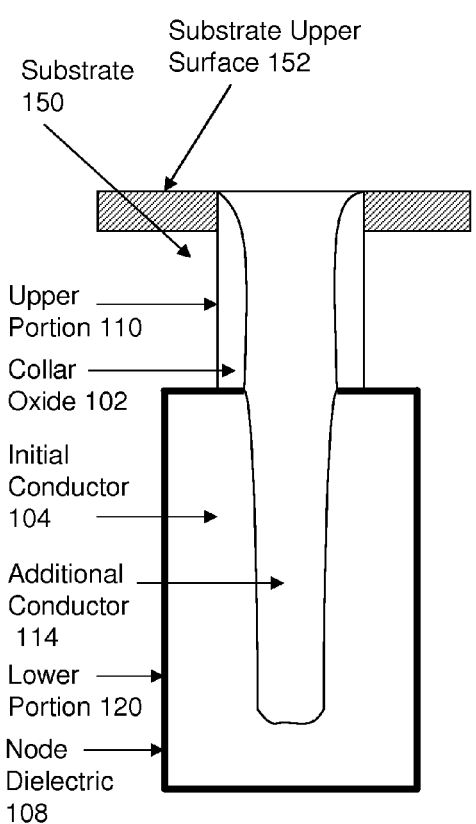

In a second embodiment shown in FIGS. 2A-2D, a different method forms the insulating collar 102 prior to forming the node dielectric 108. More specifically, this alternative embodiment begins by first forming the insulating collar 102 in the upper portion 110 of the bottle shaped trench (FIG. 2A) and then forming the node dielectric 108 in the bottle shaped trench (FIG. 2B). In one embodiment, the insulating collar 102 is formed in upper portion 110 and then the lower portion 120 is widened to form the bottle-shaped trench. Following this, the initial polysilicon 104 is deposited within the lower portion 120 of the bottle shaped trench, and again a void 106 is formed within the initial polysilicon 104. Again, the center portion of the initial polysilicon 104 is etched until the void 106 is exposed (FIG. 2C). This etching process also forms the center opening 112 within the insulating collar 102 and the initial polysilicon 104 in an identical manner as shown in FIG. 1B, discussed above. Optionally, the exposed node dielectric not covered by the initial conductor 104 can be removed. In a similar manner to the previous embodiment, additional conductor 114 is then deposited in the center opening 112 such that the additional conductor 114 is formed at least to a level of the surface of the substrate 150, as shown in FIG. 2D.

Therefore, the embodiments herein allow a bottle shaped trench capacitor to be formed free of voids. More specifically, by continuing the etching process of the insulating collar down into the initial polysilicon the void is exposed and the subsequent deposition of the additional conductor fills the void and completes the formation of the trench capacitor. By eliminating the voids from bottle shaped trench capacitors and filling the trench with additional metal or metallic compound material, the resistance of the conductor within the trench capacitors is reduced which improves the performance of the trench capacitor. Furthermore, filling the trench with additional metal or metallic compound material after forming the insulating collar advantageously avoids metal contamination during collar formation.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of forming a trench capacitor comprising:
    patterning a bottle shaped trench in a substrate, said bottle shaped trench having an upper portion and a lower portion, wherein said upper portion is adjacent a surface of said substrate and said lower portion is within said substrate, and wherein said upper portion is narrower than said lower portion;
    forming a node dielectric in said bottle shaped trench;
    depositing an initial conductor within said lower portion of said bottle shaped trench, such that a void is formed within said initial conductor;
    after depositing said initial conductor, forming an insulating collar in said upper portion of said bottle shaped trench above said initial conductor;
    simultaneously etching a center portion of said insulating collar and said initial conductor in a continuous, non-stop process until said void is exposed, wherein said etching forms a center opening within said insulating collar and said initial conductor; and
    depositing an additional conductor in said center opening such that said additional conductor is formed at least to a level of said surface of said substrate.

2. The method according to claim 1, wherein said additional conductor completely fills said center opening such that said void is eliminated.

3. The method according to claim 1, wherein said initial conductor comprises polysilicon and said additional conductor comprises a metal.

* * * * *